(12) United States Patent
Kwak

(10) Patent No.: US 9,536,591 B1
(45) Date of Patent: Jan. 3, 2017

(54) STAGGERED DLL CLOCKING ON N-DETECT QED TO MINIMIZE CLOCK COMMAND AND DELAY PATH

(71) Applicant: MICRON TECHNOLOGY, INC., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/063,229

(22) Filed: Mar. 7, 2016

(51) Int. Cl.
*G11C 8/00* (2006.01)
*G11C 11/4076* (2006.01)
*G11C 11/4091* (2006.01)
*G11C 11/4093* (2006.01)
*G11C 5/02* (2006.01)
*G11C 11/4096* (2006.01)

(52) U.S. Cl.
CPC .......... *G11C 11/4076* (2013.01); *G11C 5/02* (2013.01); *G11C 5/025* (2013.01); *G11C 11/4091* (2013.01); *G11C 11/4093* (2013.01); *G11C 11/4096* (2013.01)

(58) Field of Classification Search
CPC .......... G11C 5/02; G11C 5/025; G11C 7/222; G11C 7/1039; G11C 7/227; G11C 8/18; G11C 11/4096; G11C 11/4076; G11C 11/4091

USPC .................. 365/51, 52, 63, 191, 194, 233.1
See application file for complete search history.

(56) References Cited

U.S. PATENT DOCUMENTS

| 2011/0085394 A1* | 4/2011 | Jun ........................ G11C 7/22 365/194 |
| 2014/0247637 A1* | 9/2014 | Best ...................... G11C 5/02 365/51 |
| 2015/0028317 A1* | 1/2015 | Ichihara ............. H01L 51/5246 257/40 |
| 2016/0225431 A1* | 8/2016 | Best ...................... G11O 5/02 |

* cited by examiner

*Primary Examiner* — Gene Auduong
(74) *Attorney, Agent, or Firm* — Dorsey & Whitney LLP

(57) ABSTRACT

Apparatuses and methods are described for meeting timing and latency requirements using staggered clocking within the command path. In one example, an apparatus is disclosed that includes a timing circuit configured to provide an internal clock signal; a clock stagger circuit configured to receive the internal clock signal from the timing circuit and to generate at least one delayed internal clock signal; and a shift circuit arranged in a command decode and delay path of a command signal, coupled to the timing circuit and to the clock stagger circuit, and configured to capture the command from an external clock domain into an internal clock domain based on one or both of the internal clock signal and the delayed internal clock signal

20 Claims, 4 Drawing Sheets

STAGGERED DLL CLOCKING ON N-DETECT QED TO MINIMIZE CLOCK COMMAND AND DELAY PATH

BACKGROUND

Memory, such as dynamic random access memory (DRAM), is used in a multitude of electronics systems (e.g., portable computers, desktop computers, server systems, mobile devices, etc.) and has gone through several advancements over the years. For example, double data rate DRAM (DDRAM) was as first progression from the initial DRAM and operates at double the rate. Since then, DDRAM has also gone through a series of development milestones with each milestone improving the performance. This progression of development resulted in sequentially numbered DDRAM, e.g. DDR2, DDR3, and DDR4 development iterations. The DDR4 iteration has introduced new operating modes due to the ever increasing clock speeds of current computing systems employing DDR memories.

As DRAM's target CLK frequency continues to increase, the CAS latency control becomes more difficult due to the fact that it requires clock domain crossing from the external CLK to the internal clock (e.g., delay locked loop (DLL) clock) in a short CLK period (e.g., "fast" tCK). Also, to be competitive in the low-power DRAM market, it may be desirable to minimize unnecessary clocking when circuitry is not in use. CAS latency control scheme generally involves two clock domains where a command (read command or ODT command) is captured by a CLK-domain clock and data related to the command is provided according to the variable DLL-domain clock. In order to provide the data on time at the output PAD, the command in the CLK domain may be converted to the DLLCLK domain and also may be delayed by CAS latency (CL) and/or CAS Write Latency (CWL). Since the phase relationship between CLK and DLLCLK is variable, depending on tCK and PVT corners, it may be desirable to achieve smooth domain crossing with accurate CL calculation, especially at fast tCK operation.

DETAILED DESCRIPTION

Figure 1:
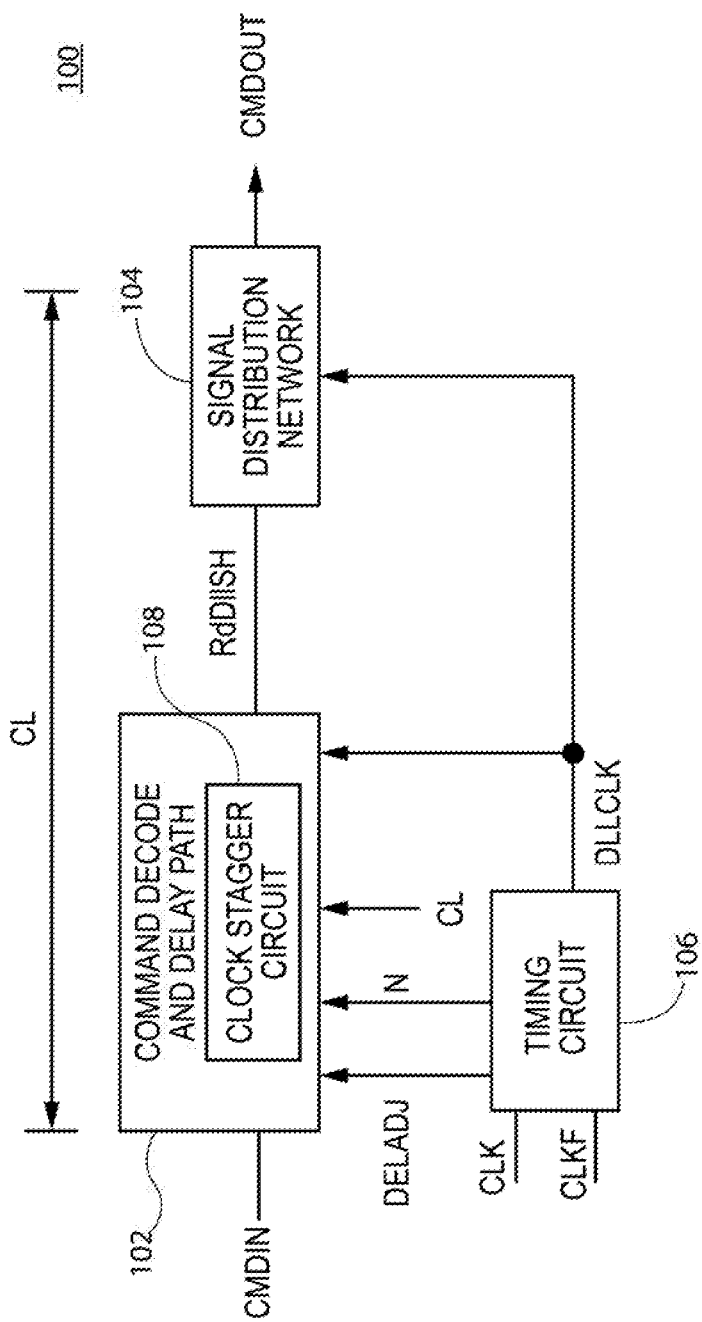
FIG. 1 is a schematic illustration of an apparatus arranged in accordance with embodiments discussed herein.

The present disclosure is directed to methods and apparatuses for meeting timing and latency requirements within a memory device using staggered clocking within the command path of the device. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As used herein, "staggered clocking" occurs when as clock signal is fed through a delay line having a plurality of stages that each add a unit of delay (e.g., one clock cycle in some embodiments). The delay Line output may include one "staggered" clock signal per stage in the delay line where each staggered clock signal is delayed by one unit with respect to a clock signal that is immediately adjacent in the upstream direction along the delay line. For example, a delay line having five stages produces an output of five staggered clock signals. The first stage produces a first staggered clock that is delayed by one unit with respect to the non-delayed clock that is fed into to the delay chain. The second stage produces a second staggered clock that is delayed by one unit with respect to the first staggered clock and two units with respect to the non-delayed clock, and so on.

In accordance with the present disclosure, staggered clock signals may be provided to various stages of a shifter circuit that is used to capture a read command from an external clock domain and into a DLL (delay locked loop) domain. A shifter circuit may include a number of shifter stages that may be implemented as flip-flops controlled via various signals including a CAS latency (CL) signal. When the read command tint arrives at the shifter, it may be delayed behind its expected position with respect to the DLL clock due to delays in the command path that are introduced by such components as the command decoder. When the command first enters the shifter, it may be picked-up by a shifter stage that is clocked with a staggered clock signal that is behind the non-delayed DLL signal by an amount corresponding to the amount by which the read command is delayed behind its expected position. As the read command propagates through the shifter, the read command goes through a series of shifter stages that are clocked with different staggered clock signals, each with progressively shorter delays with respect to the non-delayed DLL. At a certain point, the command reaches a shifter stage that is clocked by the actual DLL clock and not a staggered clock. The read command has now been "sped up" such that it is in its expected position with respect to the DLL clock. At this point, the command may exit the shifter or may be pass through additional shifter stages (which stages are clocked by DLL) and then exit the shifter. As described in greater detail below, the number of shifter stages that the command passes through before exiting the shifter may be determined so as to meet a given latency requirement.

Generally, a locked locking loop as described herein may refer to a locking loop when a reference clock signal and a feedback clock signal of the locking loop (e.g., DLL) meet a predetermined criteria (e.g., are in phase). Examples described herein generally utilize a DLL as an example locking loop, however it is to be understood that other timing circuits may be used additionally or instead—including, but not limited to, PLLs and DCCs. Latency (e.g., CAS latency) generally refers to a number of clock cycles that occur between the memory receiving a command, e.g., a read command, and when the data should appear on the output pads of the memory. Latency may be based on the system clock and the timing of internal signals and signal delays may be controlled to achieve overall timing that transfers read data at an expected time. With regards to these timings, a memory device may receive a CAS latency that is based on the external clock rate. Based on this CAS latency, the memory device may control the timing and propagation of signals so as to strobe the data pads at the expected time.

Embodiments described herein may generally implement an N-Detect QED arrangement for meeting timing and latency requirements within a memory device. As used herein, "N" refers to the propagation delay around the DLL loop expressed as an integer number of clock cycles. "N-Detect" refers the process of detecting N by counting the number of clock cycles it takes for a signal to travel around the DLL loop. The DLL may be modeled such that the propagation delay around the DLL loop is roughly the same as the propagation delay of a command through the memory. Thus, detecting N gives a rough estimate of the intrinsic delay encountered by a command as it propagates through the memory, "QED" is short for "dQ Enable Delay" and refers to the process of delaying the arrival of the read command at the data output pads such that the output pads fire at the expected time for a specified latency. Here, the intrinsic delay through the memory (as indicated by the detected N value) may be accounted for when determining the amount of time by which the arrival of the read command at the data output pads must be delayed in order to meet a latency requirement. Thus, in summary, an N-detect QED arrangement generally includes first determining an amount of intrinsic read command delay by detecting a propagation delay around a DLL loop and then using that amount in determining an amount by which a read command's arrival at the data output pads must be delayed in order to meet a latency requirement.

As mentioned, a command decoder or other command path elements may delay a command behind its expected position with respect to as DLL clock. This delay may need to be accounted for, particularly at faster clock rates. Some N-Detect QED schemes place a command decoder delay model into the DLL clock path for command capturing on faster tCKs operations. The time of as clock cycle of a clock signal may be referenced as "tCK." These arrangements may increase clock command decode and delay path delay, which may result in higher power supply sensitivity and power consumption. In order to avoid these drawbacks, the N-Detect QED systems and methods of the present disclosure remove or minimize the command delay model from the DLL command decode and delay path by adopting clock staggering inside the shifter circuit when capturing a command. Instead of having all of the command delay model on the DLL clock command decode and delay path, N-Detect QED systems and methods of the present disclosure move this delay model inside the shifter circuit and then use a slower (e.g., delayed) clock when capturing the command. The command is progressively realigned with the fastest clock as the command is propagated through the shifter circuit.

Some embodiments use an N-Detect QED arrangement that includes receiving a command that occurs at clock cycle "n" in the CLK domain and capturing the command in the DLL domain at clock cycle "n−1," that is, one clock cycle after the clock cycle n. In such a CMDIN(n)-(to-DLL(n+1) capturing, method, the command to DLL clock's setup time gets smaller as tCKs gets faster. Thus, some embodiments include shifter circuits that add more delay for faster tCKs, which typically relate to higher CL values. As tCK rates get slower, setup times tend to automatically increase accordingly. For this reason, embodiments of the shifter circuits may add lesser amounts of delay for these slower tCKs. Embodiments that include staggering clocks can accommodate faster and slower tCKs inside the shifter circuit and thus may work well with N-Detect QED arrangements that include CMDIN(n)-to-DLL(n+1) capturing, and variable clock speeds.

FIG. 1 is a schematic illustration of an apparatus 100 arranged in accordance with various embodiments discussed herein. The apparatus 100 includes a command decode and delay path 102, a signal distribution network 104 and a timing circuit 106. The apparatus 100 may receive a command CMDIN as an input, which may for example be a read command, and may be provided to the command decode and delay path 102. The command decode and delay path 102 may delay the command in accordance with a latency value (CL) received as an input, e.g., a CAS latency, and may add additional delay so that the CMDOUT is provided to output pads at an expected time in relation to the latency.

A clock signal is received by the timing circuit 106 of the apparatus 100, which is represented by clock signals CLK and CLKF (i.e., the complement of the CLK signal) and may be operating at a clock rate tCK. The timing circuit 106 may provide timing control for the command decode and delay path 102 and the signal distribution network 104 (e.g., DLLCLK) and may provide a delay adjustment control signal DELADJ to the command decode and delay path 102. The timing control may be used to ensure that the apparatus 100 provides data to the output pads with the expected timing. In some embodiments, the timing circuit 106 may be a DLL, however, other timing circuits may be used as well.

The timing circuit 106 may determine and output a loop counter value N that indicates the loop delay of the DLL. The loop delay of the DLL is the delay in tCKs for a signal to propagate from an input of the DLL, around the DLL path, and provide a feedback signal for comparison with the input. In some embodiments, the loop counter value N may be determined by the timing circuit each time the timing circuit is reset and may be indicative of a number of clock cycles it took for a DLL of the timing circuit 106 to lock (e.g., a loop delay of the DLL) the last time the Liming circuit was reset. The value of N may also affect an amount of delay added to the signal path by the command decode and delay path 102. The signal distribution network 104 may also add some delay to the command decode and delay path 102 in certain scenarios.

The apparatus 100 may additionally include a clock stagger circuit 108 that is coupled to or otherwise provided in association with the command decode and delay path 102 of the CMDIN signal. The timing circuit 106 provides an output in the form of a clock signal DLLCLK, which may be received by both the command decode and delay path 102 and the signal distribution network 104. As shown in FIG. 1, the DLLCLK signal may be provided to the clock stagger circuit 108, which in turn provides a staggered DLLCLK to the command decode and delay path 102, whereas a non-staggered DLLCLK signal may be provided to the signal distribution network 104. In some embodiments, a non-staggered DLLCLK is provided to the command decode and delay path 102 along with the staggered DLLCLK. The signal distribution network 104 may distribute the CMDOUT signal to a plurality of circuits that may be responsive to the CMDOUT signal based on the DLLLCLK signal. The clock stagger circuit 108 may operate to reduce the DLLCLK command decode and delay path delay by adopting staggered DLL clocking inside a shifter circuit of the command decode and delay path 102 when capturing a command. Using a staggered DLLCLK signal to capture the command enables the command delay model to be removed from the DLLCLK signal command decode and delay path. The reduced command decode and delay path delay may result in improved robustness to power noise (e.g., better PSS) and reduced power consumption as well.

Figure 2:
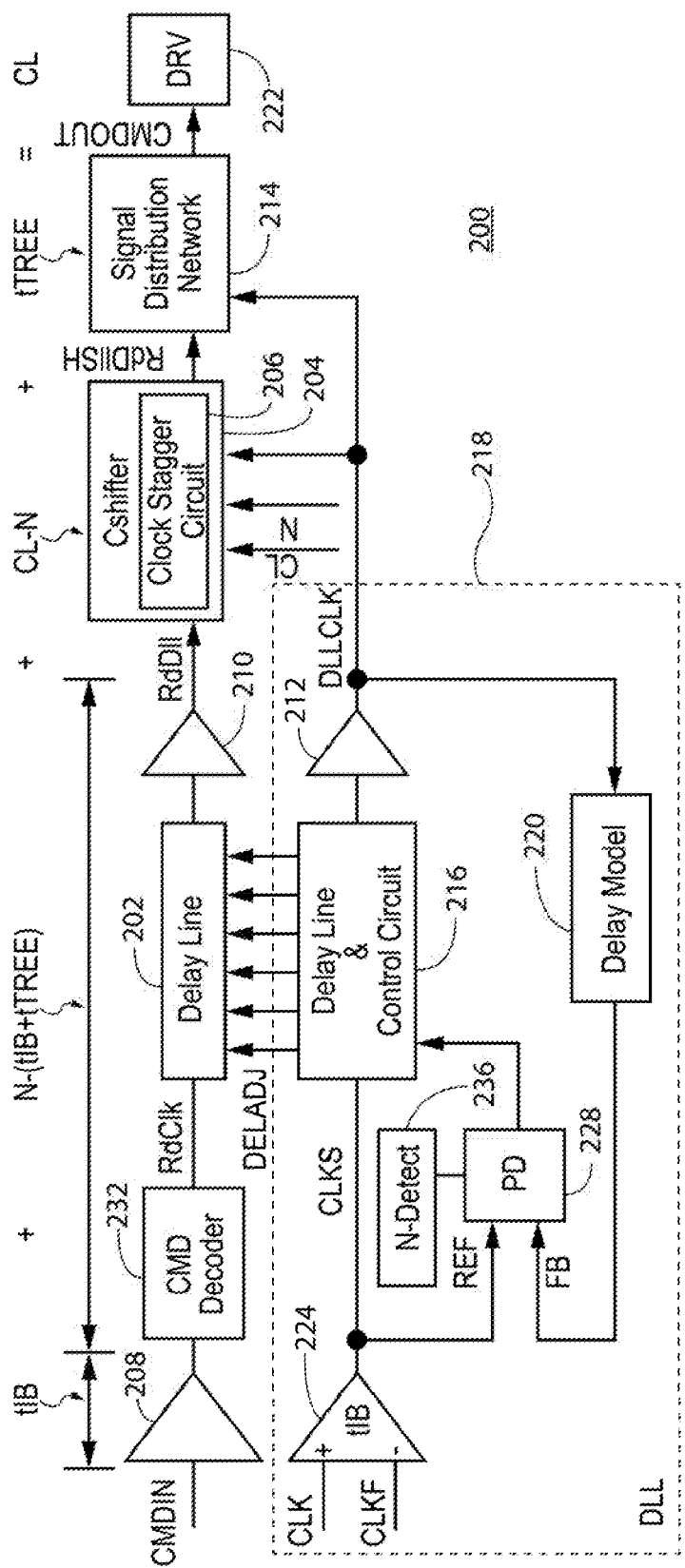
FIG. 2 is a schematic illustration of an apparatus arranged in accordance with embodiments discussed herein.

FIG. 2 is a schematic illustration of an apparatus 200 in accordance with embodiments discussed herein. The apparatus 200 may implement a DLL lock control and latency control. The apparatus 200 may receive a command CMDIN and may provide the CMDOUT to a driver circuit 222. The CMDOUT may be delayed relative to the CMDIN in accordance with a CAS latency value CL. A command path of the apparatus 200 may include a command decoder 232, an delay line 202, a shift circuit 204, two buffers 208, 210, and a signal distribution network 214. The shift circuit 204 may include or otherwise be provided in association with a clock. stagger circuit 206, such as illustrated and referred to in FIG. 1 with reference number 108. The apparatus 200 may further include a timing circuit 218, which is shown as, and referenced as, a delay lock loop (DLL) coupled to the command path of the apparatus 200. The DLL 218 may include a delay line and control circuit 216 coupled to the shift circuit 204 via a buffer 212 and also coupled to the delay line 202.

A buffer 208 may receive the CMDIN, which may be provided to an input of the command decoder 232. The command decoder 232 may decode and validate the command and then provide a corresponding RdClk signal to the delay line 202. The delay line 202 may delay the RdClk in accordance with a delay adjust signal DELADJ, provided by the delay line and control circuit 216. The delay line and control circuit 216 may include an adjustable delay circuit that is matched with an adjustable delay circuit included in the delay line 202 so as to adjust a delay of the delay line 202. An output of the delay line 202 may be provided via the buffer 210 to the shift circuit 204. The output of the buffer 210 may be the labeled RdDll, which may be a delayed version of RdClk. The command decode and delay path of the command signal may be configured so that an overall delay of the RdDll is substantially similar to a delay of a timing path including the delay line and control circuit 216, to be discussed below.

The delay line and control circuit 216 may receive input clock signal CLKS from a buffer 224. The CLKS signal may be based on an external system clock, which is represented by clock signals CLK and CLKF (i.e., the complement of the CLK signal) and may be operating at a clock rate tCk. The delay line and control circuit 216 may provide various outputs for various parts of the command path. For example, a delay adjust DELADJ signal may be provided to the delay line 202, Which may adjust an amount of delay the delay line 202 adds to a signal propagating through. The DELADJ signal may be one or more signals provided by the delay line and control circuit 216 to the delay line 202. Further, the delay line and control circuit 216 may provide delayed clock signal (based on the CLKS signal) to a buffer 212, which in turn provides a clock signal DLLCLK to the shift circuit 204 and to the signal distribution network 214. As previously discussed, the delay line and control circuit 216 may include an adjustable delay which provides the output clock signal to the buffer 212 responsive to the CLKS signal. The clock signal DLLCLK may be used by the shift circuit 204 and the signal distribution network 214 to control a timing and/or delay of signal propagation to ensure the CMDOUT signal is provided to the driver 222 with the correct timing. The DLL 218 may further provide a loop counter value N to the shift circuit 204. The loop counter value N may be determined by an N-detect circuit 236 and may be as value indicative of how many clock cycles, based on the external clock rate tCK, it takes for a signal to travel around the DLL loop from REF to FB. The value N may be stored in a register (not shown) of either the delay line and control circuit 216 or included in the apparatus 200.

The CLKS signal from the buffer 224 may also be provided to a phase detector 228. The delay line and control circuit 216 may base the DELADJ signal at least in part on a control signal from the phase detector 228. The phase detector 228 may provide the control signal to the delay line and control circuit 216 based on the clock reference signal CLKS and a feedback clock signal FB. The feedback signal FIB may be the DLLCLK signal delayed by passing through a delay model 220. The delay model 220 may model the total propagation delay of the buffer 224 and the signal distribution network 214. The phase detector 228 may measure a phase difference between the CMS (i.e., REF) and the FR signal to generate a control signal to adjust the delay line 202 and the adjustable delay circuit included in the delay line and control circuit 216 to align the phases of the CLKS and FB signal. The resulting DLLCLK signal is provided to the shift circuit 204 and to the signal distribution network 214. The shill circuit 204 receives the RdDll signal and provides a shifted RADII signal (designated in FIG. 2 as RdDllSH) based on the DLLCLK. The signal distribution network receives the RdDllSH signal and provides it to the driver circuit 222 as the CMDOUT signal with the correct timing based on DLLCLK. Additionally, as shown in FIG. 2, the phase detector 228 may be coupled to the N-detect circuit 236. In this configuration, the N-detect circuit may monitor parameters in the phase detector 228 such as the timing of the REF and FB signals and in so doing detect and output a value for N.

The output of the delay line and control circuit 216 may be received by a buffer 212, which provides the output clock DLLCLK to the delay model 220. The DLLCLK signal may be provided to a shift circuit, such as shift circuit 204 for example. The shift circuit 204 may receive a CAS latency value CL and the loop counter value N as inputs. The CL may be programmed, for example, in a mode register (not shown), and referenced in providing the CL to the shift circuit 204. The shift circuit 204 may then adjust an amount of delay based on these latency and loop counter values. Using the clock stagger circuit 206, the shift circuit 204 may stagger the DLLCLK signal in adjusting the amount of delay. By using, a staggered DLLCLK in the shift circuit 204, the apparatus 200 provides internal timing between receiving a command and providing the command according to expected timing.

The various sections of the apparatus 200 may be characterized by an amount of associated latency. This associated latency, which may also be discussed in terms of delay, may be inherent to each component. For example, the buffer 208 may be characterized by having a latency of tIB, which may be inherent to the buffer 208. Hence, for the command path portion of the apparatus 200, a total latency should add up to CL. For example, as shown in FIG. 2, the combined latency associated with the command decoder 232, the delay line 202, and the buffer 210 is N-(tIB+tTREE). The delay model 220 may be tIB plus the delay of the signal distribution network 214, e.g., tTREE. The delay of the shift circuit 204 may be (CL-N). Lastly, the delay of the signal distribution network 214 may be tTREE.

The loop delay of the DLL 218 from REF to FB (N×tCK) is typically an integer number of clock cycles once the DLL 218 achieves lock (the phase of both REF and FB is in sync). The apparatus 200 may calculate the N value inside the DLL 218, for example, by measuring the delay from REF to FB during the same time the DLL 218 is achieving initial lock. The N value may be calculated in this way so that there is no boundary issue between the N-Detect circuit's measured 'N' and the DLL's 218 actual locked 'N'. Before the N-Detect circuit 236 gets started, the entire DLL loop may be flushed out so that both REF and FB can start from a quiet state. In this way, it may be more easily determined which FB's clock edge is generated from which REF's clock edge. This digitized clock command decode and delay path delay, N, can be used for the latency calculation by having the decoded command signal propagate through to similar delay path that the DLL clock uses, so that the command decode and delay path delay from CMDIN to the driver 222 can also be N×tCK.

The block diagram for the CL control method using N is generally illustrated by FIG. 2. The command path has its own adjustable delay line 202 with delay equal to the adjustable delay line (included in the delay line and control circuit 216) of the DLL 218. The output of the adjustable delay line 202 of the command path, RdDll, also goes through the same latency of the signal distribution network 214 (e.g., tTREE) before being provided to the driver circuit 222. As a result, the total command decode and delay path delay is the same as the DLL's 218 loop delay of N×tCK. By taking this into account, the delay that the shift circuit 204 may operate to make the latency from CMDIN to the driver circuit 222 is CL. For a read command, the latency for the shift circuit 204 may be as follows:

$$\text{Shift circuit} = (CL - N) \times tCK \quad (1)$$

The CAS latency may be controlled as illustrated in FIG. 2 by adding clock-based delay of (1) into the shift circuit 204 with pre-defined CL and N values. Because both RdDll and DLLCLK are now in the same clock domain, this clock-based delay approach may address the domain crossing issue such that DLLCLK may capture RdDll at the shift circuit 204. Another benefit is that the shift circuit 204 can run on a demand basis when CMDIN is given and the DLL 218 can also be turned off until the next valid CMDIN is issued. In this way, power consumption may be reduced.

As shown in FIG. 2, RdClk is provided as input to the delay line 202 and the CLKS is provided as input to the delay line and control circuit 216. The delay line and control circuit 216 may operate to control the delay tine 202 so as to add a corresponding amount of delay into the command path. However, the RdClk may be slower due to the fact that it needs to be decoded. If the delay introduced by the command decoder 232 is not accounted for, it may be assumed that the delay from the external CMDIN to RdClk is same as the delay from CLK to REF (i.e., tIB). However, in actuality, the RdClk may be generated from a command decoder 232 that has a generally long delay due to decoding and validating the command, while the DLL's REF signal (i.e., CLKS) is quite fast and is just a buffered signal based on the CLK and CLKF signals. When the CMDIN is issued at CLK(n) (i.e., the "(n)" designating the n period of the CLK signal), CLKS(n) is generated, but it may be the case that the decoded command signal, RdClk(n) is generated more slowly than CLKS(n).

In order to capture RdClk(n) signal by using CLKS(n), the CLKS(n) may be need to be delayed by an appreciable amount to have enough setup time. In some cases, the CLKS(n) may be need to be delayed by a full tCK delay. Here, the CLKS(n) would effectively need to be delayed to CLKS(n+1) position. In other cases, the CLKS(n) may be need to be delayed by a more that a full tCK delay. One possible way to account for this discrepancy would be to add additional delay into the DLL 218 along the CLKS path. However, adding additional delay in the CLKS path is generally undesirable as it tends to increase power and power supply sensitivity (PSS) due to the longer command decode and delay path delay. It may be the case that the DLL clock path has some delay to match the RdClk decoding path. This modeling delay may play a role in meeting timing and latency requirements when tCK is at or near a minimum (tCKmin). As tCK gets relaxed (i.e., slower), the amount of delay needed to meet timing and latency requirements also gets smaller. Here, for example, a CL setting in a mode register of at DRAM chip may be indicative of the tCK used by the system.

Additional delay on the clock path could possibly provide the range of delays needed for these various scenarios. However, this approach typically hurts PSS, which results in worse jitter performance and requires more frequent tracking behavior (higher power consumption). An alternative approach to overcome this issue is to use CLKS(n+1) to capture RdClk(n). Here, additional delay required in the CLKS path can be reduced. However, since this 'n-to-(n+1)' capturing method slows down the command path delay by one tCK at the time of CLKS(n+1) capturing RdClk(n), this slowing may need to be compensated for later by adjusting (speeding up) the downstream synchronization path. In some instances, these various delays may be accounted for by adding a built-in offset of one clock cycle to the shifter 204 that captures the read command. This is described in greater detail below.

Delays occurring in the command path may also be accounted for via DLL clock staggering through the operation of the clock stagger circuit 206. Here, the command may be shifted through a series of shifter stages so as to speed the command up by a desired amount. In one respect DLL clock staggering may be used to account for delays in the command path that may not be accounted for by the model delay of the DLL. For example, as mentioned, the command decoder 232 generally has a long delay due to the time needed for decoding and validating the command. RdClk may be slowed as a result. Thus, when the read command first arrives at the shifter 204, it may be delayed behind its expected position with respect to the DLL clock. Through DLL clock staggering, the read command may be "sped up" such that it moves forward to its expected position with respect to the DLL clock. At this point, the command may exit the shifter or may be pass through additional shifter stages (which stages are clocked by DLLCLK) and then exit the shifter. The use of DLL clock staggering to account for delays in the command path is described in greater detail below with reference to FIG. 3 and an example shifter circuit 300.

DLL clock staggering may be used to account for delays in the command path with or without the use of built-in offsets in the shifters 204. The example shifter discussed below includes a built-in offset by way of example and not limitation. Additionally, DLL clock staggering may be used to account for delays in the command path the use of an 'n-to-(n+1)' capturing method. The example shifter discussed below includes an 'n-to-(n+1)' capturing method by way of example and not limitation.

Figure 3:
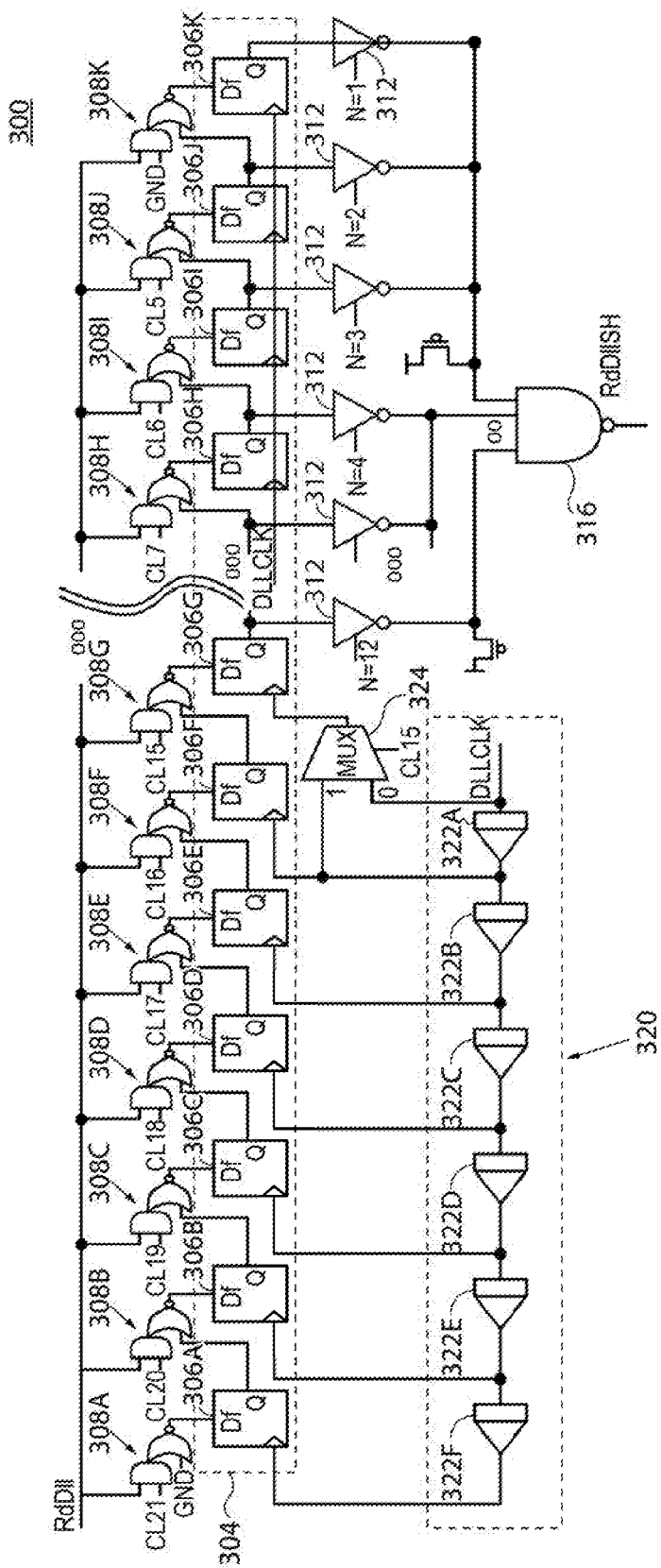
FIG. 3 is a schematic illustration of a shift circuit arranged in accordance with embodiments discussed herein.

FIG. 3 is a schematic illustration of a shift circuit 300 arranged in accordance with embodiments discussed herein. The shift circuit 204 shown in FIG. 2 may be implemented using the shift circuit illustrated in FIG. 3. The shift circuit 300 includes a flip-flop chain 304 that is configured to receive a DLL-domain command (RdDll in this example) as input. Each flip-flop 306A-K in the flip-flop chain 304 is provided RdDll through a complex gate 308A-K that provides data input to the respective flip-flop 306A-K based on certain combinations of input to the complex gate 308A-K. In the embodiment shown in FIG. 3, each of the complex gates 308A-K includes an AND gate and at NOR gate. In one respect, a complex gate 308A-K may pass RdDll through to its respective flip-flop based on a portion of the CL signal that serves as an enable signal for RdDll at that point in the flip-flop chain 304. RdDll may be passed through by the AND gate of the complex gate 308A-K. In another respect, a complex gate 308A-K may pass the output of an upstream flip-flop through to its respective flip-flop to thereby propagate a captured read command down the flip-flop chain 304. The output may be passed through the NOR gate of the complex gate 308A-K.

The flip-flop chain 304 or a portion thereof may be coupled to a group of inverters 312. Each inverter 312 may be connected to the output of a particular stage of the flip-flop chain 304. For example, the flip-flops 304G-304K are coupled to a respective inverter 312. Each inverter 312 may be additionally provided a respective N count signal corresponding to an N count value. The N count is provided as input to the shift circuit 300. Here, the respective N count signal may operate as an enable signal that, when asserted, causes a particular inverter 312 to pass the output from a particular stage in the flip-flop chain 304 out of the shift circuit 300 and downstream to a signal distribution network, for example, the signal distribution network 104 or 214 of FIGS. 1 and 2. The inverters 312 may each be connected to an input of a NAND gate 316, which may be configured to provide the output of the shift circuit 300 and downstream to the signal distribution network. In some embodiments, the DLLCLK that is clocking the flip-flop chain 304 may be gated by a burst-in-progress (BIP) signal so that the shift circuit uses power only while a read command is in progress. As soon as the NAND gate 316 outputs a signal to the signal distribution network block, the clocking may be shut off to save power.

A particular stage in the flip-flop chain 304 (as identified by its CL position) may not necessarily align with a corresponding inverter 312 (as identified by its N position) as might be expected from Equation (1) above. Rather, the shift circuit 300 may have a built-in offset that accounts for additional latencies that occur in other portions of the circuit. For example, the DQS preamble may need to be provided with a latency of '(CL−1)*tCK'. This aspect of the circuit is DQS behavior defined in some specifications for a read operation. To support this, the actual latency control may need to be sped up by 1*tCK. Here, all of the DQ's provide respective outputs with a latency of CL by just delaying an additional 1*tCK after the initial DQS. Additionally, RdDll (n) may be captured by DLLCLK(n+1), which increases the latency by 1*tCK. By way of further example, there may be a 1*tCK synchronization delay in an DQOut block right before providing the command to a driver. These last two aspects of the circuit are 'slow-down' factors in the natural latency of the command decode and delay path delay so they may need to be compensated to get the correct latency at the driver. The shift circuit 300 thus may include this modification to compensate for these slow-down factors by doing less shifting (speeds up the latency). Each of these aspects of the circuit may, by way of example, add 1*tCK delay resulting in a shift circuit 300 having a built-in offset of 3.

As a result of this built-in offset, the stages of the flip-flop chain 304 may be not be numerically aligned. For example, the shift circuit 300 shown in FIG. 3 has a built-in offset of 3 to account for additional latencies that occur in other portions of the circuit. Thus, in the shift circuit 300, the second flip-flop 306J of the flip-flop chain 304 (as identified by CL5) is coupled to the second inverter 312 (as identified by N=2), the third flip-flop 306I of the flip-flop chain 304 (as identified by CL6) is coupled to the third inverter 312 (as identified by N=3), and so on. Thus, in the event that a shift circuit includes a built-in offset, the shill circuit may be governed by an equation that differs from Equation (1) above. By way of example, the shift circuit 300 of FIG. 3 including the offset of 3 is governed by the following equation, such that it shifts fewer clock cycles than Equation (1) by subtracting out 3 tCK:

$$\text{Shift circuit} = (CL-N-3)*tCK \qquad (2)$$

In operation, the shift circuit 300 samples the DLL-domain command (RdDll in this example) via one of the flip-flops 306A-K in the flip-flop chain 304 based on CL. The captured command is synchronously delayed through the flip-flop chain 304 until it is provided through an inverter 312 that is enabled based on the N value. For example, if CL is 21 and N is 7, the RdDll signal is captured by the leftmost flip-flop 306A (DLLCLK(n+1) captures RdDll(n)) and shifts through the shift circuit 300 by propagating through eleven more flip-flops. Following this, the read command exits the shift circuit 300 through the inverter 312 that is enabled by N (=7) (not shown in FIG. 3). The actual additional shifting that occurs is thus eleven clocks, which satisfies equation (2) where 'CL−N−3=11' in this case. By way of example and not limitation, FIG. 3 assumes CL21 is the maximum CL specification.

As shown in FIG. 3, the shift circuit 300 may additionally include a delay chain 320, which may include a number of delay stages 322A-F. The delay chain 320 may be used to implement the clock stagger circuits 108, 206 discussed above in connection with FIG. 1 and FIG. 2. Each delay stage 322A-F may include a buffer that receives input from an upstream delay stage and provides output to a downstream delay stage. An initial delay stage 322A of the delay chain 320 receives as input as DLLCLK provided by a DLL, such as DLL 218 illustrated in FIG. 2. The output of the initial delay stage 322A provides a clocking input to a respective flip-flop in the flip-flop chain 304. By way of example, FIG. 3 illustrates a configuration where the initial delay stage 322A of the delay chain 320 provides clocking input for the flip-flop 306F of the CL16 stage of the flip-flop chain 320. The output of the initial delay stage of the delay chain 320 also provides an input to the next delay stage 322B. This next delay stage 322B provides a clocking input to the flip-flop 306E of the next stage (CL17) of the flip-flop chain 304 and to the next delay stage 322C. This configuration continues until the last delay stage of the delay chain 320 is reached. The output of the last delay stage 322F provides a clocking input the highest numbered flip-flop in the flip-flop chain 304. By way of example, FIG. 3 illustrates a configuration where the final delay stage 322F of the delay chain 320 provides a clocking input for the flip-flop 306A of the CL21 stage of the flip-flop chain 320.

The shift circuit 300 of FIG. 3 may generally operate to delay the arrival of the read command at the data output pads such that the output pads fire at the expected time for a specified latency. The flip-flop chain 304 operate by shifting the command through a series of flip-flops 306A-306K that are controlled via various signals including a CAS latency (CL) signal. The intrinsic delay through the memory (as indicated by the detected N value) may be accounted for by the inverters 312, which determine the point along the flip-flop chain 304 that the command may stop further propagating down the chain 304 and exit the shifter via the NAND gate 316. The shift circuit 300 may be configured such that higher CL flip-flops (e.g., flip-flops 306A-D) have more delayed clocks and tower CL flip-flops have less delayed (e.g., flip-flops 306E-G) or no delayed clocks (e.g., flip-flops 306G-K). More specifically, higher delay stages in the flip-flop chain receive a version of DLLCLK that has passed through more delay stages of the delay chain 320. In this arrangement, a captured command may be sped up between the time the command is captured and the time when it is used to provide data at the data pads. Here, the shift circuit 300 uses delayed clocks on higher CLs to capture the command properly and then, gradually speed up while it is propagated. When the command needs to exit the shifter 300 via the NAND gate 316 (picked by 'N'), it is automatically on the DLLCLK (no delay). Once the command exits via the NAND gate 316, the command may progress towards the signal distribution network (such as shown in FIG. 1 and FIG. 2) to fire the data output pads in accordance with a specified latency.

Referring to FIG. 3, RdDll (DLL domain Read command) is received and provided through one of the complex gates 308 based on CL. The RdDll keeps being shifted until it meets the corresponding N that the DLL previously calculated. All flip-flops use a common DLLCLK or a delayed version of DLLCLK to provide the 'CL–N–3' function. Additional delay on the DLL clock path is not present or needed. Instead, this delay may be incorporated inside of shift circuit 300, which does a proper command capture by using DLL clock staggering through the delay chain 320. This improves PSS and may also reduce power consumption by the DLL since clocking of the shift circuit 300 may be enabled only during a read burst. With the CMDIN(n) to DLLCLK(n+1) capturing method, as tCK gets faster, it requires more setup time between RdDll and DLLCLK (i.e., more delay on DLLCLK). Slow tCKs may not need any extra delay on DLLCLK. Higher CL typically corresponds to faster tCKs. The final output of the shift circuit 300 selected by "N" may be clocked by DLLCLK (i.e., the fastest DLL clock without delay).

FIG. 3 additionally includes a multiplexer 324 that is arranged between the first delayed stage 322A of the DLL-CLK signal and the non-delayed DLLCLK. The multiplexer 324 may form a portion of the clock stagger circuits 108, 206 discussed above in connection with FIG. 1 and FIG. 2. The multiplexer 324 is optional in the sense that the shifter 300 may or may not include the multiplexer 324. As shown in FIG. 3, a first input of the multiplexer 324 is provided the DLLCLK signal from a DLL, such as the DLL 218 shown in FIG. 2. A second input of the multiplexer 324 is provided a delayed DLLCLK signal delayed through the first delay stage 322A of the delay chain 320. The multiplexer 324 may be used in the event that the flip-flops 306G-K that are coupled to the output path (through NAND gate 316) need a delayed DLLCLK to get more CMDIN setup time for a particular CL/tCKmin. In this case, the multiplexer 324 between delayed (output from the first stage 322A of the delay chain 320) and non-delayed (DLLCLK) clocks can be selected between "shifting" and "capturing" modes. Shifting between these two modes may occur responsive to a CL input that corresponds to a flip-flop 306G that is on the border between delayed 306A-G and non-delayed 306H-K stages of the flip-flop chain 304 (CL15 in FIG. 3). It may be at this point, that extra setup time is needed when capturing a command. For example, if the CL15's flip-flop 306G captures the CMDIN, then an N value 12 may not properly give an appropriate latency and timing result. Instead, if CL15's flip-flop 306G captures the CMDIN, a smaller number for the N value may give the appropriate latency and timing result. Thus, the CL15 line may be used to toggle the multiplexer 324 between "shifting" and "capturing" modes.

Figure 4:
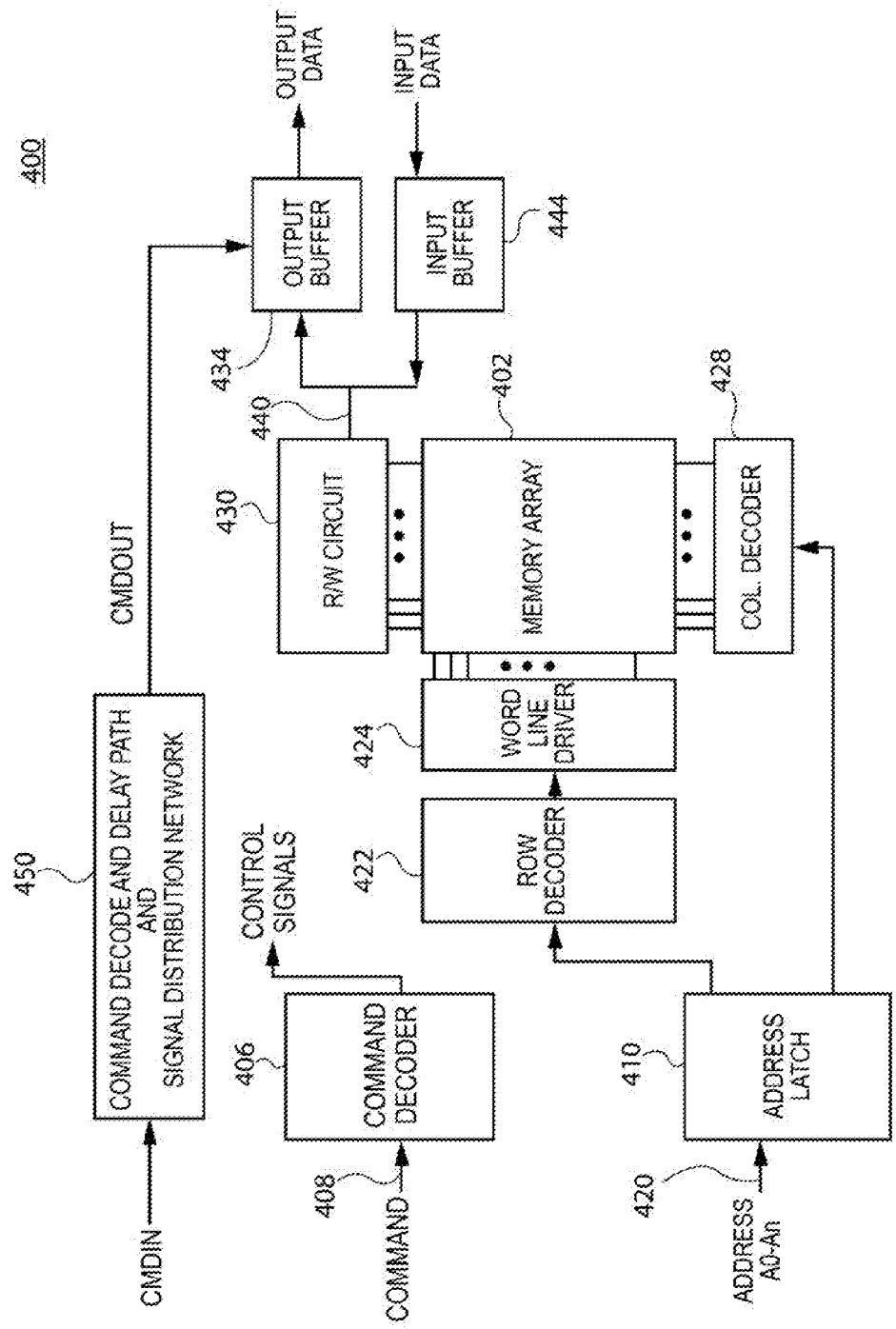
FIG. 4 is an illustrative block diagram of a memory arranged in accordance with embodiments discussed herein.

FIG. 4 illustrates a memory 400 including a timing domain transfer circuit arranged according to an embodiment as discussed herein. The memory 400 includes an array 402 of memory cells, which may be, for example, volatile memory cells (e.g., DRAM memory cells, SRAM memory cells), non-volatile memory cells (e.g., flash memory cells), or some other types of memory cells. The memory system 400 includes a command decoder 406 that receives memory commands through a command bus 408 and generates corresponding control signals within the memory system 400 to carry out various memory operations. The command decoder 406 responds to memory commands applied, to the command bus 408 to perform various operations on the memory array 402. For example, the command decoder 406 is used to generate internal control signals to read data from and write data to the memory array 402. Row and column address signals are applied to the memory system 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. The data output buffer 434 may include a driver as illustrated and referenced in FIG. 2 with numeral 222. Write data are applied to the memory array 402. through a data input buffer 444 and the memory array read/write circuitry 430.

A command decode and delay path and signal distribution network 450 may be used to delay command signals with respect to a latency, such as a CAS latency, and may operate based on a clock signal provided by the timing circuit. Further, the command decode and delay path 450 may be configured with an N-Detect QED arrangement that removes or reduces the command delay model from the DLL command decode and delay path by including clock staggering inside a shifter when capturing a command from a memory controller. instead of having all the command delay model on the DLL clock command decode and delay path, N-Detect QED arrangement of the command decode and delay path 450 may move this delay model inside the shifter. As previously described, the command decode and delay path 450 may use a slower (e.g., delayed) clock, when capturing the command but progressively realigned with the fastest clock as the command is propagated through the shifter.

The command decode and delay path 450 may include a QED block that has a number of QED shifters implemented as flip-flops controlled via various signals including a CAS latency (CL) signal. A QED block command decode and delay path 450 may be configured such that higher CL flip-flops have more delayed clocks and lower CL flip-flops have less delayed or no delayed clocks. In this arrangement, a captured command may be sped up between the time the command is captured and the time when it is used to provide data at the data pads.

Thus, the command decode and delay path 450 may use staggered clock signals that are provided to various stages of a shifter circuit that is used to capture a read command from an external clock domain and into a DLL (delay locked loop) domain. The command decode and delay path 450 may use shifter circuit may include a number of shifter stages that may be implemented as flip-flops controlled via various signals including a CAS latency (CL) signal. As previously mentioned, when the read command first arrives at the shifter, it may be delayed behind its expected position with respect to the DLL clock due to delays in the command path that are introduced by such components as the command decoder. When the command first enters the shifter, it may be picked-up by a shifter stage that is clocked with a staggered clock signal that is behind the non-delayed DLL signal by an amount corresponding to the amount by which the read command is delayed behind its expected position. As the read command propagates through the shifter, the read command goes through a series of shifter stages that are clocked with different staggered clock signals, each with progressively shorter delays with respect to the non-delayed DLL. At a certain point, the command reaches a shifter stage that is clocked by the actual DLL clock and not a staggered clock. The read command has now been "sped up" such that it is in its expected position with respect to the DLL clock. At this point, the command may exit the shifter or may be pass through additional shifter stages (which stages are clocked by DLL) and then exit the shifter. As described in greater detail below, the number of shifter stages that the command passes through before exiting the shifter may be determined so as to meet a given latency requirement.

Some embodiments of the command decode and delay path 450 may use a N-detect QED that includes receiving a command that occurs at clock cycle "n" in the CLK domain and capturing the command in the DLL domain at clock cycle "n+1". In such a CMDIN(n)-to-DLL(n+1) capturing embodiments, the command to DLL clock's setup time may get smaller as tCKs gets faster. Thus, some embodiments of the command decode and delay path 450 may include QED blocks that add more delay for faster tCKs, which typically indicate higher CL values. At tCK rates get slower, setup times tend to automatically increase accordingly. For this reason, as previously mentioned, QED block embodiments may add lesser amounts of delay for these slower tCKs. Clock staggering embodiments of the command decode and delay path 450 can accommodate faster and slower tCKs inside the QED block and thus work well with N-Detect QED setups that include CMDIN(n)-to-DLL(n+1) capturing and variable clock speeds.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:
1. An apparatus, comprising:
 a timing circuit configured to receive an external clock signal and provide an internal clock signal;
 a clock stagger circuit configured to receive the internal clock signal and provide at least one delayed internal clock signal; and
 a command decode and delay path configured to receive a command, and further configured to delay the command and provide a delayed command, wherein the command decode and delay path includes a shift circuit coupled to the timing circuit and to the clock stagger circuit, and configured to receive the internal clock signal from the timing circuit and to receive the at least one delayed internal clock signal from the clock stagger circuit, the shift circuit further configured to capture the delayed command according to an external clock domain and provide the delayed command according to an internal clock domain based on one or both of the internal clock signal and the delayed internal clock signal.

2. The apparatus of claim 1, wherein the shift circuit is configured to capture the command synchronously with the delayed internal clock signal and to speed up propagation of the command through the command decode and delay path such that the command is synchronous with the internal clock signal.

3. The apparatus of claim 2, wherein the command becomes synchronous with the internal clock signal at least before the command exits the shift circuit.

4. The apparatus of claim 2, wherein the command decode and delay path includes a command decoder configured to decode the command, and wherein the shift circuit is configured to speed up the propagation of the command so as to make up for a delay in the command path introduced by the command decoder.

5. The apparatus of claim 1, wherein the shift circuit is additionally configured to delay propagation of the command to provide data at an expected time based on a specified latency.

6. The apparatus of claim 1. wherein:
 when a frequency of the external clock is above a threshold, the shift circuit captures the command synchronously with the delayed internal clock and speeds up the command such that the command is synchronous with the internal clock; and
 when the frequency of the external clock is below the threshold, the shift circuit captures the command synchronously with the internal clock.

7. The apparatus of claim 1. wherein the clock stagger circuit includes a chain of series coupled delay stages, each delay stage configured to provide an additional delay of one clock cycle.

8. The apparatus of claim 1. wherein the shift circuit includes a multiplexer configured to selectively couple a first input or a second input to an output responsive to as specific latency, the first input configured to receive the internal clock signal and the first input coupled to an input of a delay stage, the second input coupled to an output of the delay stage.

9. The apparatus of claim 1, wherein the timing circuit is a delay locked loop.

10. The apparatus of claim 1. further comprising:
 a signal distribution network coupled to an output of the command decode and delay path,
 wherein the timing circuit is further configured to provide the internal clock signal to the signal distribution network.

11. A method of controlling signals in a memory device, comprising:
 providing an internal clock signal from a delay locked loop;
 receiving the internal clock signal at a clock stagger circuit;

generating at least one delayed internal clock signal at the clock stagger circuit based on the internal clock signal; and capturing a command from an external clock domain into an internal clock domain based on one or both of the internal clock signal and the delayed internal clock signal.

12. The method of claim 11, further comprising:

capturing the command synchronously with the delayed internal clock signal; and speeding up propagation of the command through a command decode and delay path such that the command is synchronous with the internal clock.

13. The method of claim 11, further comprising:

delaying propagation of the command to provide data at an expected time based on a specified latency.

14. The method of claim 11, further comprising:

when a frequency of the external clock is above a threshold, capturing the command synchronously with the delayed internal clock and speeding up the command such that the command is synchronous with the internal clock; and when the frequency of the external clock is below the threshold, capturing the command synchronously with the internal clock.

15. An apparatus, comprising:

a memory controller configured to provide a memory read command; and a memory configured to:

capture the command from an external clock domain into an internal clock domain synchronously with a delayed internal clock signal;

speed up propagation of the command through a shift circuit such that the command is synchronous with an internal clock; and provide data responsive to the read command including providing data at an expected time based on a specified latency.

16. The apparatus of claim 15, wherein the shift circuit comprises a plurality of flip-flops that are connected to a command decode and delay path of a command signal for the memory read command through a respective complex gate.

17. The apparatus of claim 16, wherein each flip-flop of the shift circuit is additionally connected to a portion of as latency signal through the respective complex gate.

18. The apparatus of claim 16, wherein the shift circuit further comprises a plurality of inverters configured to receive a respective loop counter value, each inverter configured to receive an output from a respective one of the flip-flops of the shift circuit.

19. The apparatus of claim 16, wherein each complex ate comprises a AND gate configured to receive the respective loop counter value, and a NOR gate coupled to the AND gate, the NOR gate coupled to an input of a respective flip-flop.

20. The apparatus of claim 19, wherein the internal clock is provided by a delay locked loop.

* * * * *

UNITED STATES PATENT AND TRADEMARK OFFICE
CERTIFICATE OF CORRECTION

PATENT NO.        : 9,536,591 B1
APPLICATION NO.   : 15/063229
DATED             : January 3, 2017
INVENTOR(S)       : Jongtae Kwak Page 1 of 1

It is certified that error appears in the above-identified patent and that said Letters Patent is hereby corrected as shown below:

| On the Title Page | Reads | Should Read |
|---|---|---|
| Title (Item (54)) | "STAGGERED DLL CLOCKING ON N-DETECT QED TO MINIMIZE CLOCK COMMAND AND DELAY PATH" | --STAGGERED DLL CLOCKING ON N-DETECT QED TO MINIMIZE CLOCK COMMAND DECODE AND DELAY PATH-- |

In the Claims

| | | |
|---|---|---|
| Column 14, Line 49 Claim 8 | "...to an output responsive to as specific..." | --...to an output responsive to a specific...-- |
| Column 14, Line 56 Claim 10 | "The apparatus of claim 1. further comprising:" | --The apparatus of claim 1, further comprising:-- |
| Column 16, Line 16 Claim 17 | "...is additionally connected to a portion of as..." | --...is additionally connected to a portion of a...-- |
| Column 16, Line 23 Claim 19 | "The apparatus of claim 16, wherein each complex ate..." | --The apparatus of claim 16, wherein each complex gate...-- |

Signed and Sealed this
Sixth Day of June, 2017

Michelle K. Lee
*Director of the United States Patent and Trademark Office*